(12) United States Patent
Lee et al.

(10) Patent No.: US 12,170,105 B2
(45) Date of Patent: Dec. 17, 2024

(54) ONE TIME PROGRAMMABLE (OTP) MAGNETORESISTIVE RANDOM-ACCESS MEMORY (MRAM)

(71) Applicant: Taiwan Semiconductor Manufacturing Company, Ltd., Hsinchu (TW)

(72) Inventors: Po-Hao Lee, Hsinchu (TW); Chia-Fu Lee, Hsinchu (TW); Yi-Chun Shih, Taipei (TW)

(73) Assignee: Taiwan Semiconductor Manufacturing Company, Ltd, Hsinchu (TW)

( * ) Notice: Subject to any disclaimer, the term of this patent is extended or adjusted under 35 U.S.C. 154(b) by 0 days.

(21) Appl. No.: 18/175,087

(22) Filed: Feb. 27, 2023

(65) Prior Publication Data

US 2023/0223062 A1    Jul. 13, 2023

Related U.S. Application Data

(63) Continuation of application No. 17/222,213, filed on Apr. 5, 2021, now Pat. No. 11,594,269.
(Continued)

(51) Int. Cl.
*G11C 11/00* (2006.01)
*G11C 11/16* (2006.01)
(Continued)

(52) U.S. Cl.
CPC ........ *G11C 11/1673* (2013.01); *G11C 11/005* (2013.01); *G11C 11/1657* (2013.01); *G11C 11/1659* (2013.01); *G11C 11/1675* (2013.01); *G11C 17/16* (2013.01); *G11C 17/18* (2013.01); *H10B 61/22* (2023.02)

(58) Field of Classification Search
CPC . G11C 17/16; G11C 11/1673; G11C 11/1675; G11C 17/18; G11C 17/02; G11C 11/005; G11C 11/161; G11C 11/1659; G11C 17/165; G11C 11/16; G11C 11/1657; G11C 11/409; G11C 11/419; G11C 2213/71; G11C 7/14; G11C 11/15; G11C 11/1655; G11C 11/5607; G11C 11/5671; G11C 17/08; G11C 11/1677; G11C 29/021; G11C 29/028; G11C 29/78; G11C 29/785

See application file for complete search history.

(56) References Cited

U.S. PATENT DOCUMENTS 9,455,015 B2    9/2016   Slaughter et al.
9,805,816 B2 *  10/2017  Jan ..................... G11C 11/1675
(Continued)

FOREIGN PATENT DOCUMENTS

CN   102067231 A    5/2011
CN   102265350 A    11/2011
(Continued)

*Primary Examiner* — Thong Q Le
(74) *Attorney, Agent, or Firm* — Merchant & Gould P.C.

(57) ABSTRACT

A memory device includes a plurality of magnetoresistive random-access memory (MRAM) cells including a first one-time programmable (OTP) MRAM cell. A first OTP select transistor is connected to the first OTP MRAM cell. The first OTP select transistor configured to selectively apply a breakdown current to the first OTP MRAM cell to write the first OTP MRAM cell to a breakdown state.

20 Claims, 9 Drawing Sheets

Related U.S. Application Data

(60) Provisional application No. 63/041,508, filed on Jun. 19, 2020.

(51) Int. Cl.
 _G11C 17/16_ (2006.01)
 _G11C 17/18_ (2006.01)
 _H10B 61/00_ (2023.01)

(56) References Cited

U.S. PATENT DOCUMENTS

| | | |
|---|---|---|
| 11,049,539 B1 | 6/2021 | Sanjeevarao et al. |
| 2019/0180173 A1 | 6/2019 | Torng et al. |
| 2020/0098440 A1 | 3/2020 | Chuang et al. |

FOREIGN PATENT DOCUMENTS

| | | |
|---|---|---|
| CN | 102282622 A | 12/2011 |
| CN | 103003883 A | 3/2013 |
| CN | 104538057 A | 4/2015 |
| CN | 107636762 A | 1/2018 |
| EP | 3 667 668 A1 | 6/2020 |
| KR | 10-2020-0034925 A | 4/2020 |

\* cited by examiner

ONE TIME PROGRAMMABLE (OTP) MAGNETORESISTIVE RANDOM-ACCESS MEMORY (MRAM)

CROSS REFERENCE TO RELATED APPLICATION

This application is a Continuation of U.S. application Ser. No. 17/222,213, filed Apr. 5, 2021, which issues as U.S. Pat. No. 11,594,269 on Feb. 28, 2023, which claims the benefit of U.S. Provisional Application No. 63/041,508, filed Jun. 19, 2020, the disclosure of which is hereby incorporated herein by reference.

BACKGROUND

Non-volatile memory is memory that retains data in the absence of power. Magnetoresistive random-access memory (MRAM) is a non-volatile random access memory (RAM) technology that uses magnetic storage elements to store data. An MRAM device includes an array of MRAM cells, each of which is implemented as a single-bit cell to store a binary data value. Each MRAM cell includes a magnetic tunnel junction ("MTJ" or "MTJ element") formed of a pair of ferromagnetic layers separated by a thin insulating layer. The two layers include a magnetic layer that is permanently magnetized in a fixed magnetic field alignment direction (this layer is referred to as a pinned layer), and a changeably-magnetized magnetic layer (this layer is referred to as a free layer).

The changeably-magnetized magnetic layer can be magnetized in one of two orientations relative to the permanently magnetized layer. The two orientations are characterized by distinctly different serial resistances through the superimposed layers of the MTJ. The magnetic field orientation of the changeable layer can be aligned the same as that of the permanent magnet layer (parallel), or the magnetic field of the changeable layer can be aligned directly opposite to that of the permanent magnet layer (anti-parallel). The parallel alignment state has a relatively lower resistance, namely a low logic state "0". The anti-parallel alignment state has a higher resistance, namely a high logic state "1". These two states as sensed from their relatively higher or lower resistances represent different binary logic values of bits in the memory.

Non-volatile memory includes one-time-programmable (OTP) memory. OTP memory is read-only memory that may only be programmed once. Once programmed, the contents cannot be changed and the contents are retained after power is removed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

DETAILED DESCRIPTION

Figure 1:
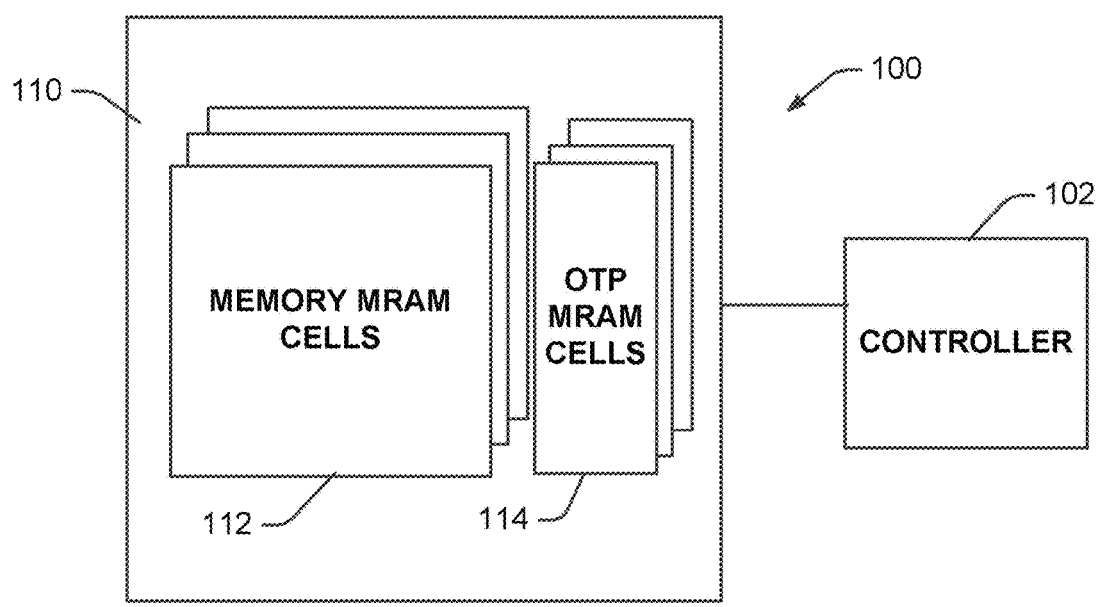
FIG. 1 is a block diagram illustrating an example of an MRAM OTP memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Magnetoresistive random-access memory (MRAM) is a non-volatile random access memory technology that uses magnetic storage elements to store data. An MRAM device includes an array of MRAM cells, each of which is implemented as a single-bit cell to store a binary data value. Each MRAM cell includes a magnetic tunnel junction ("MTJ" or "MTJ element") formed of a pair of ferromagnetic layers separated by a thin insulating layer. The two layers include a magnetic layer that is permanently magnetized in a fixed magnetic field alignment direction (this layer is referred to as a pinned layer), and a changeably-magnetized magnetic layer (this layer is referred to as a free layer).

The changeably-magnetized magnetic layer can be magnetized in one of two orientations relative to the permanently magnetized layer. The two orientations are characterized by distinctly different serial resistances through the superimposed layers of the MTJ. The magnetic field orientation of the changeable layer can be aligned the same as that of the permanent magnet layer (parallel), or the magnetic field of the changeable layer can be aligned directly opposite to that of the permanent magnet layer (anti-parallel). The parallel alignment state has a relatively lower resistance and the anti-parallel alignment state has a higher resistance. These two states as sensed from their relatively higher or lower resistances represent different binary logic values of bits in the memory.

The two states of an MRAM cell can be sensed from their relatively higher or lower resistances (RH and RL), which represent different binary logic values of a bit stored in the memory. For example, RL (or high cell current) may be designated as a logical "0" ("Data-0"); RH (or low cell current) may be designated as a logical "1" ("Data-1"). A bit of data, a logic "0" or "1" value, stored in a MRAM memory cell can be determined by comparing a current that flows through the memory cell to another current that flows through another memory cell.

More particularly, MRAM stores data at memory cells having the MTJ element formed of the pinned layer and the free layer, separated by a thin insulating layer. The free layer can be magnetized in one of two orientations relative to the permanently magnetized layer. The two orientations are characterized by distinctly different serial resistances through the superimposed layers of the MTJ. The magnetic field orientation of the changeable layer can be aligned the same as that of the permanent magnet layer (parallel, or "Rp") or opposite to that of the permanent magnet layer (anti-parallel, or "Rap"). The parallel alignment state Rp has a relatively lower resistance and the anti-parallel alignment state Rap has a higher resistance.

A one-time-programmable (OTP) memory is a read-only memory that may only be programmed once. Once programmed, the contents cannot be changed and the contents are retained after power is removed. As noted above, MRAM is a type of non-volatile memory. As such, it retains data in the absence of power. However, certain events of conditions could cause MRAM memory to lose data stored therein. For instance, certain high temperature events such as solder reflow or Wafer Level Chip Scale Packaging (WLCSP) may cause MRAM data loss. As such, conventional MRAM devices have generally not been suitable for OTP applications, and typically another OTP memory is provided, where the setting of each data bit is locked by a fuse or antifuse or other write lock circuitry. Providing such separate OTP memory uses additional chip space and increases manufacturing complexity.

Various embodiments of the present application are directed to an OTP memory implementation using MRAM memory cells, providing advantages such as reduced area requirements, lower costs and reduced process complexity. FIG. 1 illustrates an example of MRAM OTP memory device 100 in accordance with aspects of the present disclosure. The memory device 100 includes an array 110 of a plurality of MRAM cells. In the illustrated example, the memory array 110 includes an array of MRAM bit cells 112 operated for conventionally storing data as well as one or more OTP MRAM cells 114 operated for OTP functions. Thus, as used herein, MRAM bit cells 112 refer to MRAM memory cells used for conventional MRAM data storage, while OTP MRAM cells 114 refer to MRAM memory cells used for OTP data storage. The memory device 100 further includes a memory controller 102 that receives a memory address and controls various components of the device 100 to read or write data to the array 110. The memory controller 102 may include various circuits as discussed further below.

Figure 2:
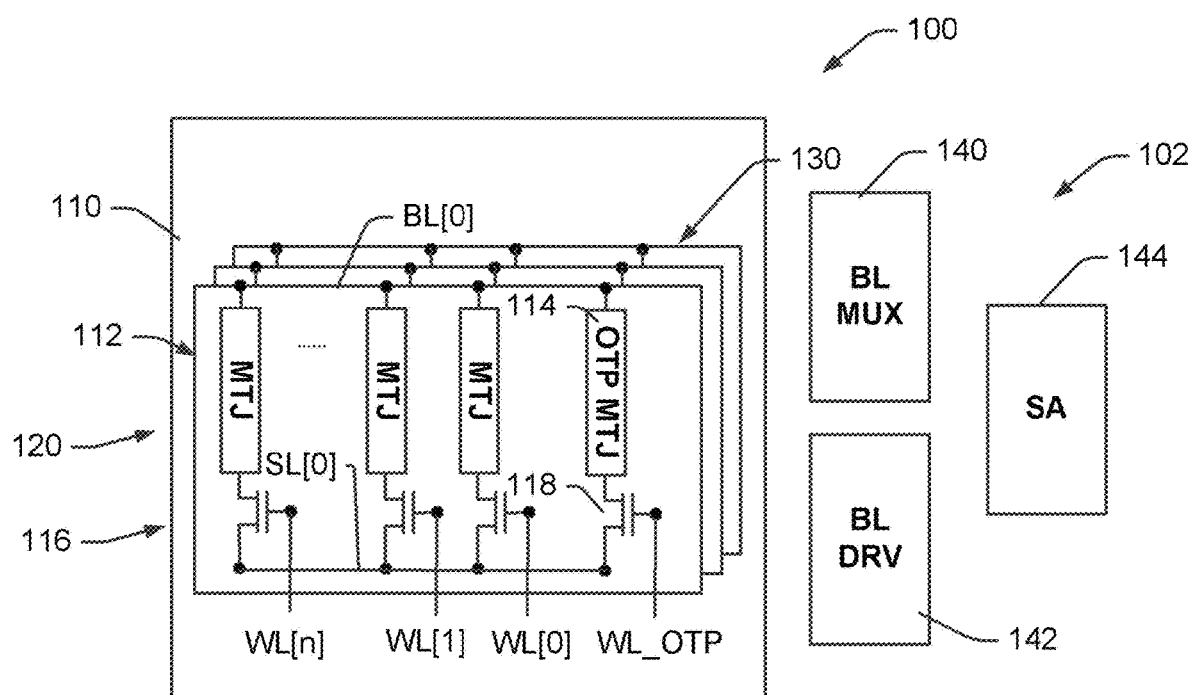
FIG. 2 is a block diagram illustrating further aspects of the example MRAM OTP memory device of FIG. 1 accordance with some embodiments.

FIG. 2 illustrates further aspects of an example of the memory device 100. The MRAM array 110 includes an array of the MRAM bit cells 112, as well as the OTP MRAM cells 114 arranged in rows and columns. For simplicity of discussion, FIG. 2 shows only a single column of the MRAM bit cells 112 and OTP MRAM cells 114 is shown in detail. In the illustrated example, the MRAM bit cells 112 each include an MTJ element 120, and the OTP MRAM cells 114 each also include an MTJ element 130. Each column of the array 110 has a corresponding bit line BL and a corresponding source line SL. In FIG. 2, only the first bit line BL[0] and the first source line SL[0] for the first row of MTJ elements 120, 130 are shown. Each row of the array has a corresponding word line WL. In the illustrated example, the rows of MRAM bit cells each have a corresponding memory word line WL[0-n], while the illustrated OTP MRAM cell 114 has a corresponding OTP word line WL_OTP. Moreover, in the illustrated embodiment, the MRAM bit cells 112 and the OTP MRAM cell 114 are connected to the bit line BL[0]. In other examples, the OTP MRAM cell(s) may be connected to a separate, dedicated bit line.

Each of the MRAM bit cells 112 has a corresponding memory cell select transistor 116 coupled between the MTJ element 120 of the MRAM bit cell 112 and the source line SL[0]. Each of the memory cell select transistors 116 has its gate terminal coupled to the word line WL[0-n] for the corresponding row. Similarly, the OTP MRAM cell 114 has a corresponding OTP select transistor 118 coupled between the OTP MTJ element 130 of the OTP MRAM cell 114 and the source line SL[0]. The OTP select transistor 118 has its gate terminal coupled to the OTP word line WL_OTP. In the illustrated example, the memory cell select transistors 116 and the OTP select transistor 118 are NMOS transistors, though other switching devices are within the scope of the disclosure.

The memory controller 102 of the memory device 100 further includes a sense amplifier 144 connected to the bit lines BL to read currents that flow through memory bit cells 112 and OTP MRAM cells 114 and compare them to a reference current to read data from the memory array 110. Further, a bit line multiplexer 140 is configured to select a bit line BL based on a received memory address, and a bit line driver 142 configured to vary electrical potential on the bit lines BL.

In an exemplary write operation for writing data to the MRAM bit cells 112, write voltages are applied to the bit line BL0, the source line SL0, and the appropriate word line WL[0-n]. For instance, a voltage applied to the word line WL[0] activates the memory cell select transistor 116 connected thereto and a write current flows through the connected MRAM bit cell 112. That write current flows through the MTJ 120 of the MRAM bit cell 112, causing the MTJ 120 to switch from a parallel state to an anti-parallel state or vice versa, whereby a bit of data is written and stored in the MRAM bit cell 112. When it is desired to switch the MTJ 120 from the anti-parallel state to the parallel state to store a "0" value, a switch current is passed through the MTJ 120 from the free layer to the reference layer. Conversely, when it is desired to switch the MTJ 120 from the parallel state to the anti-parallel state to store a "1" value, a switch current is passed through the MTJ 120 from the reference layer to the free layer.

When the free layer of the MIS 120 is in the parallel state, the MU 120 exhibits a low resistance that represents a logic "0" value and the MTJ 120 is said to be in a parallel state or a low resistance state Rp. Conversely, when the free layer is in the anti-parallel state, the MTJ 120 exhibits a high resistance that represents a logic "1" value and the MTJ 120 is said to be in an anti-parallel state or a high resistance state Rap. In some embodiments, the logic represented by the MTJ 120 in a high or low resistance state is arbitrary, e.g. the logic "1" can be represented by the MTJ 120 in a low resistance state and the logic "0" can be represented by the MTJ 120 in a high resistance, and is determined by the desired convention used for the memory device. Whichever convention is chosen, the MIT 120 can store binary data via two writeable and readable states, e.g. the high resistance and low resistance states. For purposes of consistency, embodiments described herein will use the convention that the MTJ 120 in the low resistance parallel state Rp represents a "0" and the MTJ 120 in the high resistance anti-parallel state Rap represents a "1," unless otherwise stated.

In an exemplary read operation, read voltages are applied to the bit line BL[0] and the source line SL[0] associated with the column of a selected bit cell 112 to be read, as well as the word line WL[0-n] associated with the word line of a selected MRAM bit cell 112 to be read. For example, read voltages can be applied to the bit line BL[0], the source line SL[0], and the word line WL[0] to read the data bit stored in the connected MRAM bit cell 112. To select other cells, different combinations of bit lines, source lines, and word lines are activated to produce a read current indicative of the data stored at the respective cell.

In the example shown, when the MRAM bit cell 112 is read, a read current Tread flows through the MTJ 120. The magnitude of the read current Tread corresponds to a resistance state of the MTJ 120. For example, when the MTJ 120 is in a low resistance state, i.e.; a parallel state Rp, the read current Tread will be greater than a reference current Iref from a reference cell. This indicates that the MRAM bit cell 112 stores a bit logic "0" value of data therein. Conversely, when the MTJ 120 is in a high resistance state. i.e., an anti-parallel state Rap, the read current Tread will be less than the reference current Iref, indicating that the MRAM bit cell 120 stores a bit logic "1" value of data therein. The sense amplifier 144 can compare the read current Tread to the reference current Iref to sense a bit logic "0" or "1" value of data stored in the MRAM bit cell 112. The sense amplifier 144 amplifies a level of the sensed bit of data and outputs the amplified bit of data such that the hit of data stored in the MRAM bit cell 112 can be read therefrom.

As noted above, certain events such as a high temperature event may cause loss of the data bits written to the MRAM bit cells 112 via the processes described above. This can make the MRAM bit cells unsuitable for OTP use. In accordance with disclosed embodiments, the OTP select transistor 118 is configured to selectively apply a breakdown current to the OTP MRAM cell 114, which is higher than the conventional write current applied to the MTJ elements 120 of the MRAM bit cells 112. The higher breakdown current damages or destroys the insulating layer of the OTP MTJ element 130. This results in an even lower breakdown resistance state Rbd for the OTP bit cell 114, which is lower than the low resistance parallel state Rp and the high resistance anti-parallel state Rap. Accordingly, the read current for the breakdown state Rbd will be higher than the read currents corresponding to the low resistance Rp state and the high resistance Rap state. Still further, once the breakdown current has been applied to the OTP MTJ element 130 of the OTP bit cell 114 to place the OTP bit cell in the breakdown state, it cannot be reversed. As such, the OTP bit cell 114 functions as an OTP memory element, maintaining the breakdown state even after a high temperature event such as WLCSP.

The OTP select transistor 118 is configured to apply the breakdown current to the OTP MRAM cell 114 to write the OTP MRAM cell 114 to breakdown state in response to the signal on the WL_OTP word line received at the gate terminal of the OTP select transistor. In some embodiments, the OTP select transistor 118 thus is a "stronger" transistor in that it is capable of conducting a higher current level. In various implementations, the OTP select transistor 118 may include a larger size transistor, a lower threshold (Vt) implant transistor, a thinner oxide transistor, multiple transistors, and the like.

Thus, for an OTP write operation of the device 100 shown in FIG. 2, the OTP word line WL_OTP is activated, turning on the OTP select transistor 118. This connects one terminal of the OTP MRAM cell 114 to the source line SL[0] through the OTP select transistor 118. A bit line voltage signal VBL is applied to the bit line BL[0] while the corresponding source line SL[0] is connected to ground, resulting in the breakdown current flowing through the OTP MTJ element 130 of the OTP MRAM cell 114. This results in the OTP MRAM cell 114 having the low breakdown resistance Rbd (i.e. lower than either the Rp or Rap states) and accordingly a high read current.

Figure 3:
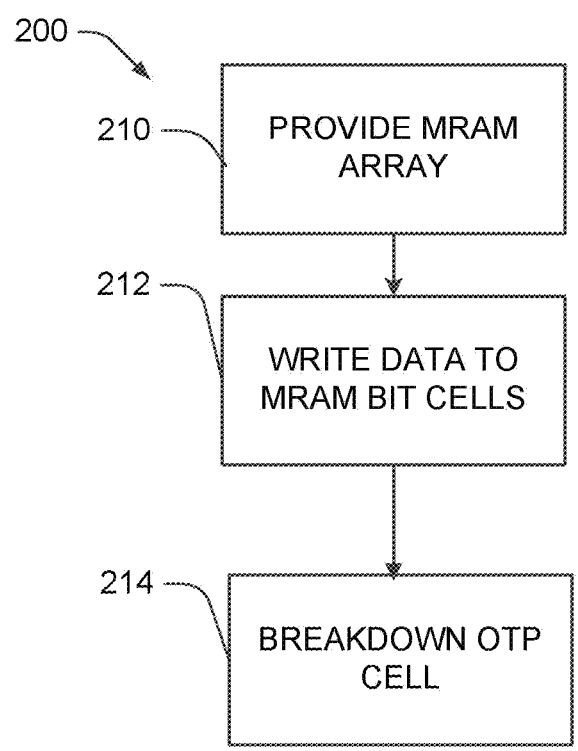
FIG. 3 is flow diagram illustrating an example of an OTP method in accordance with some embodiments.

FIG. 3 illustrates a general method 200 for operating the memory device 100 in accordance with disclosed embodiments. At operation 210, an MRAM cell array such as the array 110 is provided. As operation 212, a write current is applied to selected ones of MRAM bit cells 112 in the MRAM array 110 to selectively write the MRAM bit cells 112 to a parallel state or an anti-parallel state (i.e. data 0 or data 1). At operation 214, an OTP write process occurs where, for example, a breakdown current higher than first write current is applied to an OTP MRAM cell 114 in the MRAM cell array 100 to write the OTP MRAM cell 114 to a breakdown state.

Figure 4:
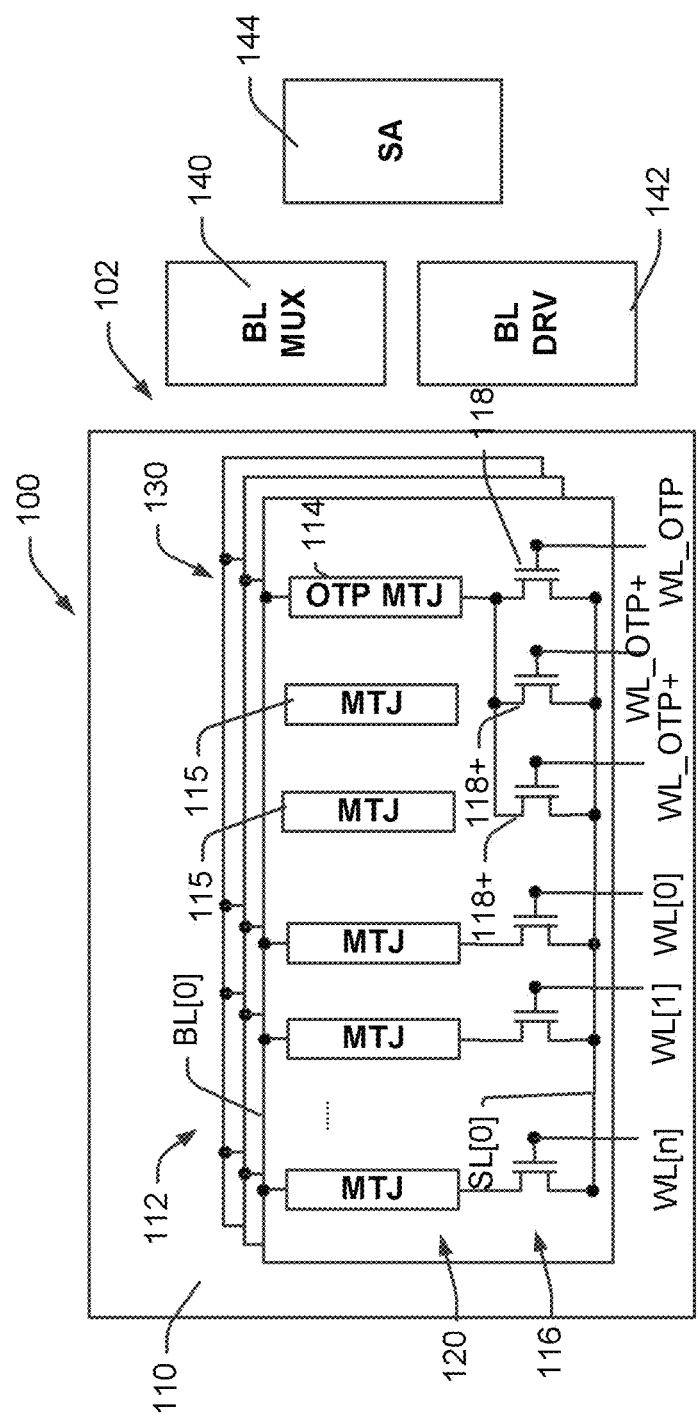
FIG. 4 is a block diagram illustrating further aspects of the example MRAM OTP memory device of FIG. 1 accordance with some embodiments.

FIG. 4 illustrates an example the memory device 100 in accordance with some embodiments, where the OTP select transistor 118 includes multiple OTP select transistors 118 coupled together in parallel. In the example of FIG. 3, in addition to the OTP select transistor 118 mentioned above, there are two additional OTP select transistors 118+ such that there are three OTP select transistors 118, 118+ connected in parallel. Similarly, there are two additional OTP word lines WL_OTP+, for a total of three OTP word lines. Other numbers of OTP select transistors 118, 118+ and OTP word lines WL_OTP, WL_OTP+ are within the scope of the disclosure.

The multiple OTP select transistors 118, 118+ in parallel can, for example, apply the higher breakdown current to breakdown the corresponding OTP MRAM cell 114. As noted previously, in some other examples, the OTP transistors 118 regardless of being individually connected to respective OTP MRAM cells or being coupled in parallel, can implement a stronger type of transistor for providing the breakdown current to the OTP MRAM cell(s) 114 than that for the MRAM bit cells 112. However, in the embodiment of FIG. 4, the construction of the OTP transistors 118, 118+ may be the same or similar to the memory cell select transistors 116, since the higher break down current is achieved by activating the multiple OTP select transistors 118, 118+.

In a typical MRAM memory arrangement, each MTJ element 120 would be connected to a corresponding memory cell select transistor 116 and word line WL[0-n]. In the illustrated embodiment, the memory device 100 includes dummy MRAM cells 115. This results from the select transistors near the OTP MRAM cell 114 (now OTP select transistors 118+) being connected to the OTP MTJ element 130 of the OTP MRAM cell 114, rather than to their corresponding MRAM bit cells 112 (now dummy cells 115). The dummy cells 115 now are not connected to select transistors or word lines. They are further disconnected from the corresponding bit line BL[0] and source line SL[0].

In some conventional MRAM memory devices, dummy MTJ elements may sometimes be placed towards the edge of a memory array, protecting the "active" MRAM cells towards the inner region of the memory array from non-uniformity that may occur at the edge of the array. In some disclosed embodiments, the OTP MRAM cells 114 have a low resistance (resulting the high read current) in their broken down state. As such, the OTP MRAM cells 114 are less susceptible to non-uniformity. This, in turn, allows the OTP MRAM cells 114 to be placed at an edge of the array with and/or in place of the dummy MTJ elements 115 to further protect the MTJ elements 120 of the MRAM bit cells 112.

Moreover, providing the multiple (e.g. three) distinct OTP word lines WL_OTP, WL_OTP+ provides a "tunable" solution for providing the breakdown current to the OTP MRAM cell 114. In other words, the amount of current provided to the OTP MTJ element 130 of the OTP MRAM cell 114 can be varied by activating a desired number of the OTP word lines WL_OTP, WL_OTP+. Activating all three of the illustrated OTP word lines WL_OTP, WL_OTP+ turns on all three of the illustrated OTP select transistors 118, 118+, providing more current to the OTP MRAM cell 114 than if only two of the illustrated OTP word lines WL_OTP, WL_OTP+ activate the corresponding two OTP select transistors 118, 118+. Further, additional OTP word lines WL_OTP+ and OTP select transistors 118+ (i.e. more than three) may be added if a higher current is required to breakdown the OTP MTJ element 130 of the OTP MRAM cell 114.

Thus, for an OTP write operation of the device 100 shown in FIG. 3, the OTP word lines WL_OTP, WL_OTP+ are activated, turning on the corresponding OTP select transistors 118, 118+. This connects one terminal of the OTP MRAM cell 114 to the source line SL[0] through the parallel-connected OTP select transistors 118, 118+. A bit line voltage signal VBL is applied to the bit line BL[0] while the corresponding source line SL[0] is connected to ground, resulting in the breakdown current flowing through the OTP MTJ element 130 of the OTP MRAM cell 114. This results in the OTP MRAM cell 114 having the low breakdown resistance Rbd (i.e. lower than either the Rp or Rap states) and accordingly a high read current.

Figure 5:
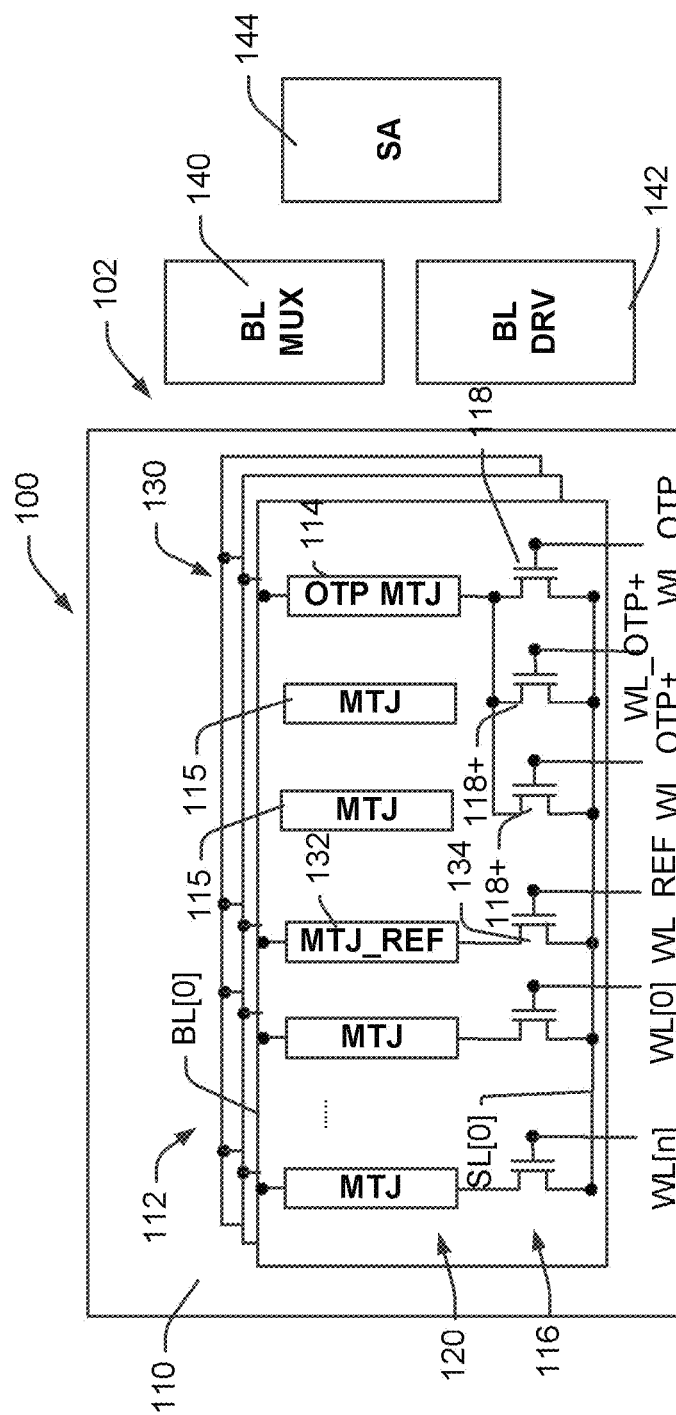
FIG. 5 is a block diagram illustrating further aspects of the example MRAM OTP memory device of FIG. 1 accordance with some embodiments.

In some examples, at least one MRAM cell may be configured as a reference MRAM cell. FIG. 5 illustrates another example of the memory device 100, where the memory array 110 includes a reference MRAM cell 132. A reference select transistor 134 is connected to the reference MRAM cell 132 and is configured to apply a write current to write the reference MRAM cell 132. Some disclosed examples employ a "one cell per bit" (1CPB) OTP write process. In other words, OTP data is written to one OTP MRAM cell 114. The OTP data bit is then read from the OTP MRAM cell 114 by the sense amplifier 144 comparing the OTP MRAM cell 114 read current Ibd to the read current of the MRAM reference cell 132. In the illustrated embodiment, the MRAM bit cells 112, reference MRAM cell 132 and the OTP MRAM cell(s) 114 are all connected to the bit line BL[0]. In other examples, the OTP MRAM cell(s) 114 and/or the reference MRAM cell 132 may be connected to separate, dedicated bit lines.

Figure 6:
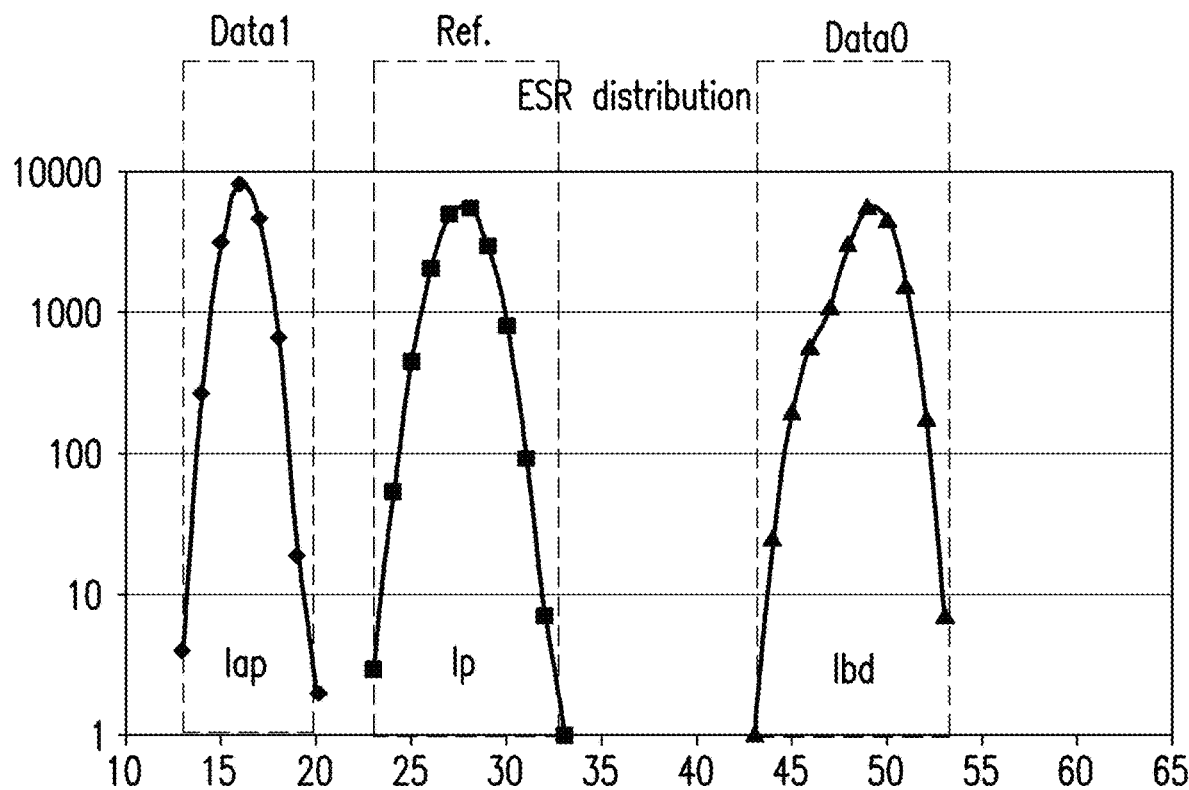
FIG. 6 is a diagram illustrating distributions of read currents for an example of an MRAM OTP memory device in accordance with some embodiments.

FIG. 6 illustrates the distribution of the read currents in an example 1CPB OTP operation that includes the reference MRAM cell 132. The "Data1" curve at the left portion of the chart illustrates the read current Iap through an MTJ element in the anti-parallel state—i.e. data 1. In other words, if the OTP MRAM cell 114 is to be written as a data 1, the breakdown current is not applied to the OTP MRAM cell 114, and instead it may be written to the Rap state. The read current Iap in the anti-parallel state is the lowest because the resistance state Rap of the anti-parallel state is the highest. The "Data0" curve at the right portion of the chart illustrates the read current through the OTP MRAM cell 114 in the breakdown state (ie after the breakdown current has been applied to the MTJ element 130 of the OTP MRAM cell 114). The read current through the OTP MRAM cell 114 in the broken-down state Ibd is the highest because the resistance state Rbd of the broken-down state is the lowest. As discussed further below, the MRAM reference cell 132 is written to the parallel state (i.e. reference read current is Ip). The "Ref." curve between the Data1 curve and the OTP curve illustrates the read current through the reference MRAM cell 132 that is in the parallel state. The reference MRAM cell 132 is in the parallel state, so the read current through the reference MRAM cell 132 in the parallel state Ip is between Iap current and the breakdown current Ibd the because the resistance in the parallel state Rp between the anti-parallel state resistance Rap and the breakdown state resistance Rbd.

Figure 7:
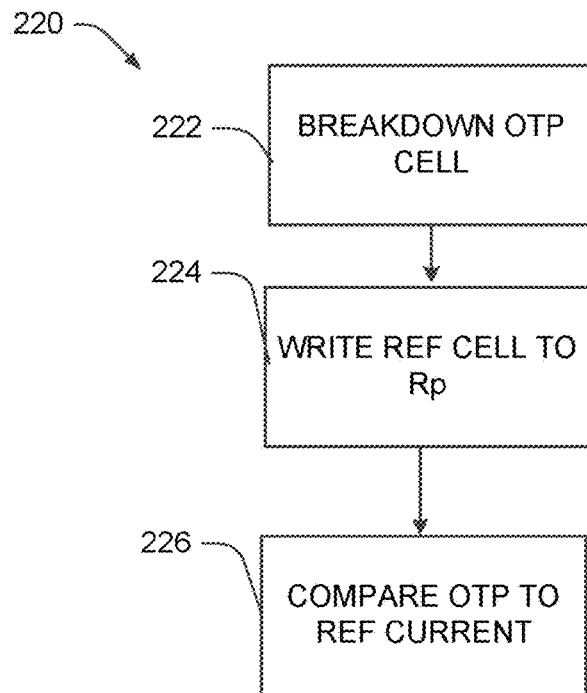
FIG. 7 is flow diagram illustrating an example of a one cell per bit (1CPB) OTP method in accordance with some embodiments.

FIG. 7 is a flow chart illustrating an example of a 1CPB OTP write process 220. At operation 222, the OTP MRAM cell 114 is written to the breakdown state as described above. A write-verify operation may then optionally be performed, in which the reference word line WL_REF is activated to turn on the reference select transistor 134 and write the reference MRAM cell 132 to the parallel Rp state as indicated at operation 224. A read voltage Vr may then be applied to the bit line BL[0], and the resulting OTP MRAM cell 114 read current Ibd can then be compared to the reference MRAM cell read current Ip to verify the breakdown state of the OTP MRAM cell 114. If it is not desired to write the OTP MRAM cell 114 to the breakdown state (i.e. the OTP MRAM cell 114 is to be written to data 1) in the OTP programming process, the breakdown current is not applied to the OTP MRAM cell 114. The write verify operation 224 may still be performed to verify the non-breakdown state (i.e. data 1) of the OTP MRAM cell 114.

Figure 8:
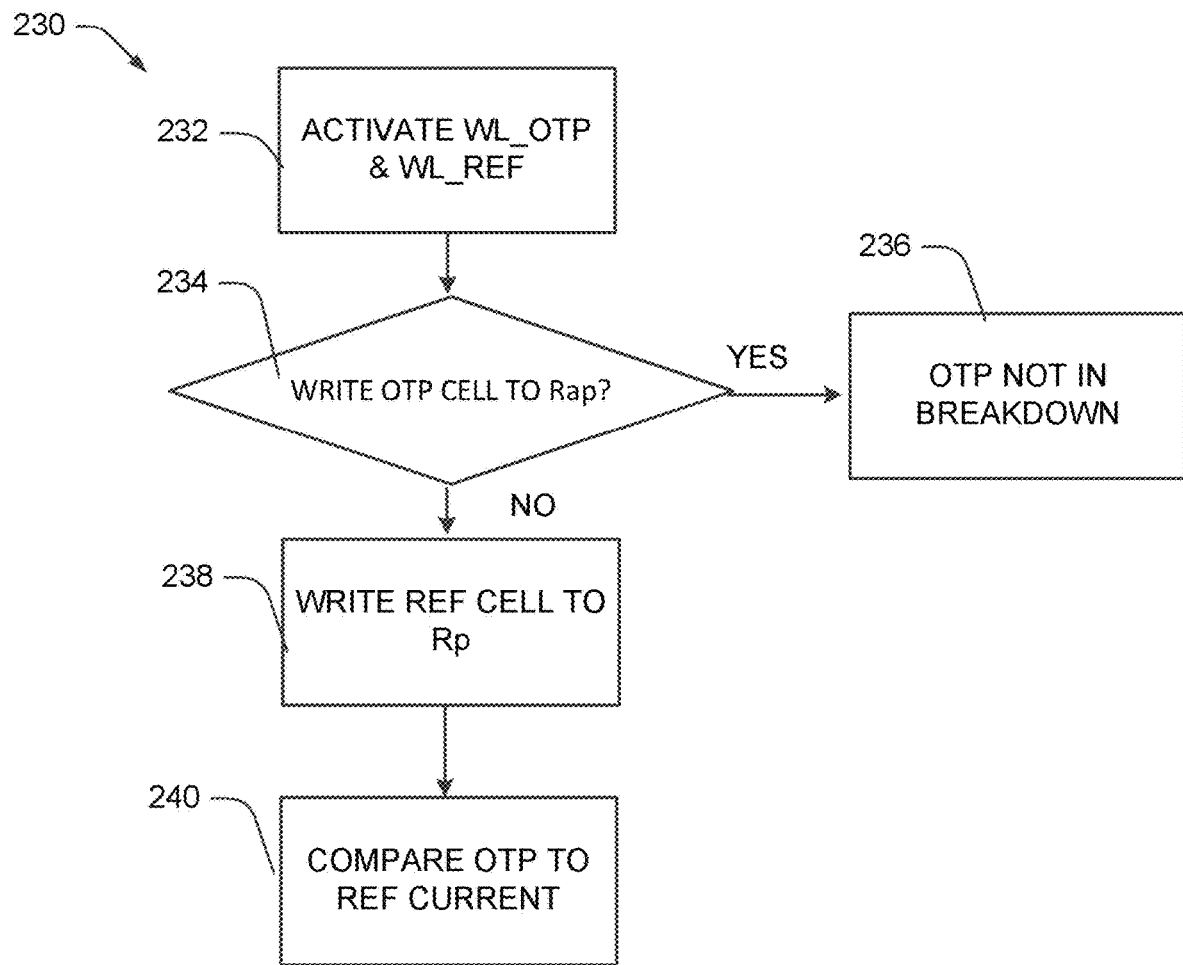
FIG. 8 is flow diagram illustrating another example of a 1CPB OTP method in accordance with some embodiments.

FIG. 8 illustrates 1CPB OTP read operation 230, which may be executed subsequent to a high temperature event such as WLCSP. At operation 232, the OTP word line WL_OTP and the reference word line WL_REF are both activated. Since the breakdown current is not applied for a read operation, the additional OTP word lines WL_OTP+ are not activated. An optional OTP read verify operation may then be conducted at operation 234, in which a write current is applied to the OTP MRAM cell 114 to attempt to write it to the anti-parallel Rap state. If the OTP MRAM cell 114 was previously written to the breakdown state during the OTP write process, it will not be possible to write the OTP MRAM cell 114 to the Rap state (or the Rp state). Thus, if the OTP MRAM cell is written to the anti-parallel state Rap in operation 234, the OTP MRAM cell 114 is not in the breakdown state as indicated at operation 236. In other words, at operation 236 the OTP MRAM cell 114 contains a data 1 bit.

If the OTP MRAM cell is not able to be written to the anti-parallel state Rap in operation 234, the OTP MRAM cell 114 is the breakdown state, and at operation 238 the reference MRAM cell 132 is written to the parallel state Rp. A read voltage Vr is then applied to the bit line BL[0] to establish read currents in the reference MRAM cell 132 and the OTP MRAM cell 114, and at operation 240, the OTP MRAM cell 114 read current is compared by the sense amplifier 144 to the read current Ip of the reference MRAM cell in the Rp state to determine the breakdown state of the OTP MRAM cell 114.

Figure 9:
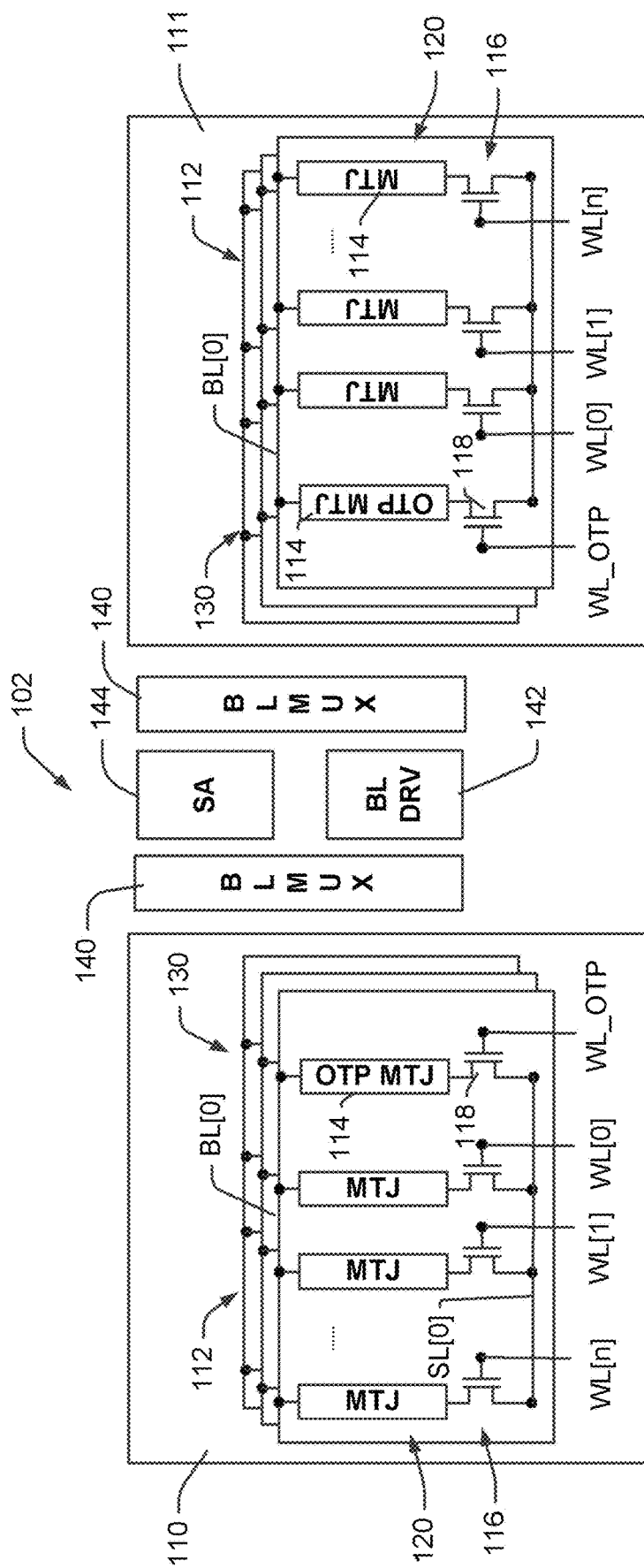
FIG. 9 is a block diagram illustrating further aspects of the example MRAM OTP memory device of FIG. 1 accordance with some embodiments.

FIG. 9 illustrates another example of the memory device 100 that includes the memory array 110 and also a second array 111. In the illustrated example, the arrays 110 and 111 are arranged symmetrically, though non-symmetric arrangements are within the scope of the disclosure. Moreover, the illustrated example shows the arrays 110, 111 in a side-by-side arrangement, though other implementations my have other arrangements, such as one array situated over the other.

Each of the arrays 110, 111 shown in FIG. 9 include the MRAM bit cells 112, as well as the OTP MRAM cells 114 arranged in rows and columns. The MRAM bit cells 112 each include an MTJ element 120, and the OTP MRAM cells 114 each include an MTJ element 130. Each column of the arrays 110, 111 has a corresponding bit line BL and a corresponding source line SL, and each row of the array has a corresponding word line WL. The rows of the MRAM bit cells 112 each have a corresponding memory word line WL[0-n], while the illustrated OTP MRAM cells 114 each have a corresponding OTP word line WL_OTP.

In each array 110, 111, each of the MRAM bit cells 112 has a corresponding memory cell select transistor 116 coupled between the MTJ element 120 of the MRAM bit cell 112 and the source line SL[0]. Each of the memory cell select transistors 116 has its gate terminal coupled to the word line WL[0-n] for the corresponding row. Similarly, the OTP MRAM cell 114 has a corresponding OTP select transistor 118 coupled between the OTP MTJ element 130 of the OTP MRAM cell 114 and the source line SL[0]. The OTP select transistor 118 has its gate terminal coupled to the OTP word line WL_OTP.

The memory controller 102 of the memory device 100 illustrated in FIG. 9 has a sense amplifier 144 connected to the bit lines BL of each array 110, 111 to read currents that flow through memory bit cells 112 and OTP MRAM cells 114 and compare them to a reference current to read data from the memory arrays 110, 111. Further, bit line multiplexers 140 are configured to select a bit line BL in respective arrays 110, 111 based on a received memory address, and a bit line driver 142 is configured to vary electrical potential on the bit lines BL. The illustrated example shows a single sense amplifier 144 and bit line driver 142 for both arrays 110, 111, though in other implementations each array could have a respective sense amplifier 144 and bit line driver 142.

To increase the read margin for the OTP MRAM cells 114, some examples use a two cell per bit (2CPB) read and write process for the OTP programming function using the OTP MRAM cells 114. In disclosed 2CPB processes, complementary data are written to two OTP MRAM cells 114. For example, one OTP MRAM cell 114 may be written to the breakdown state, while another OTP MRAM cell 114 is not broken down. In other words, if the first OTP transistor(s) 118, 118+ apply a breakdown current to write the first OTP MRAM cell 114 to the breakdown state, OTP transistor(s) 118, 118+ connected to the other OTP MRAM cell 114 do not apply a breakdown current. In the illustrated example, the OTP MRAM cell 114 in the array 110 and the OTP MRAM cell 114 in the array 111 function as complementary cells for the 2CPB OTP operation. However, the complementary OTP MRAM cells do not necessarily have to be in different arrays.

Figure 10:
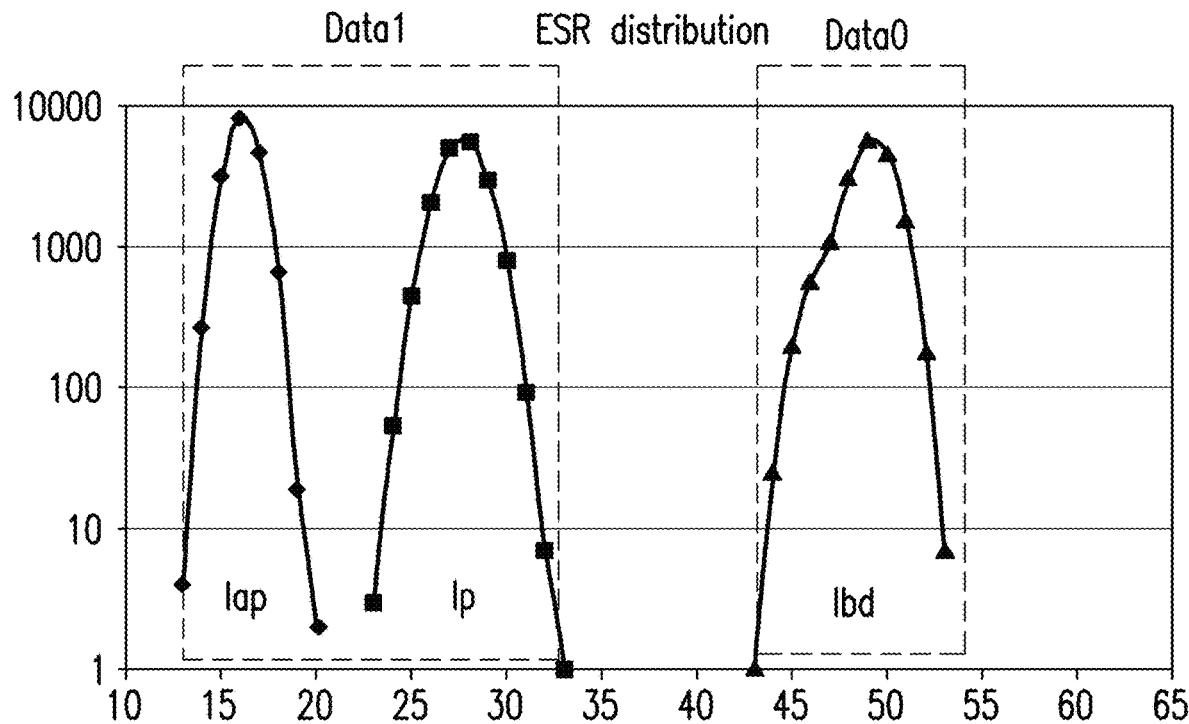
FIG. 10 is a diagram illustrating distributions of read currents for another example of an MRAM OTP memory device in accordance with some embodiments.

FIG. 10 illustrates the distribution of the read currents in an example 2CPB OTP operation. The "Data1" curves at the left portion of the chart illustrates the read currents Iap and Ip for an MTJ element in the Rap or Rp state—i.e. OTP data 1. The "Data0" curve at the right portion of the chart illustrates the read current through an OTP MRAM cell 114 in the breakdown state (ie after the breakdown current has been applied to the MTJ element 130 of the OTP MRAM cell 114). The read current through the OTP MRAM cell 114 in the broken-down state Ibd is the highest because the resistance state Rbd of the broken-down state is the lowest. As discussed further below, for the 2CPB operation one OTP MRAM cell 114 is written to the breakdown state and thus exhibits a read current Ibd as shown in FIG. 10. Another complementary OTP MRAM cell 114 is not written to the breakdown state and as such will not exhibit Ibd read current. Instead, the complementary OTP MRAM cell may be conventionally written to the Rap state (data 1) to exhibit the read current Iap. Comparing the breakdown read current Ibd of the OTP MRAM cell 114 to the read current Iap of the complementary OTP MRAM cell 114 provides a wider read margin than comparing the breakdown read current Ibd to a reference read current Ip as shown in the example of FIG. 6.

Figure 11:
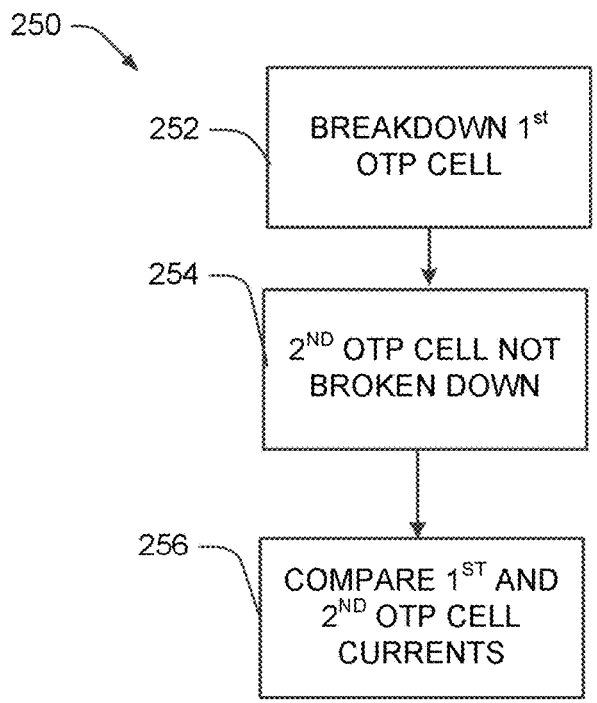
FIG. 11 is flow diagram illustrating an example of a two cell per bit (2CPB) OTP method in accordance with some embodiments.

FIG. 11 illustrates an example method for a 2CPB write operation 250. Referring to FIGS. 9 and 10 together with FIG. 11, the method 250 starts with writing a first OTP MRAM cell, such as the OTP MRAM cell 114 of the array 110, to the breakdown state as described above at operation 252. However, as indicated at operation 254, a second OTP MRAM cell, such as the OTP MRAM cell 114 of the array 111, is not to the breakdown state. This second OTP MRAM cell is also referred to as a complement or complementary OTP MRAM cell herein. At operation 256, a write-verify operation may optionally be performed, in which a read voltage Vr may be applied to the bit lines BL[0] of each of the arrays 110, 111 to establish and compare read currents of the respective OTP MRAM cells 114 of the arrays 110, 111. The resulting read currents may then be compared by the sense amplifier 142 to verify the breakdown state of the first OTP MRAM cell 114 of the array 110.

Figure 12:
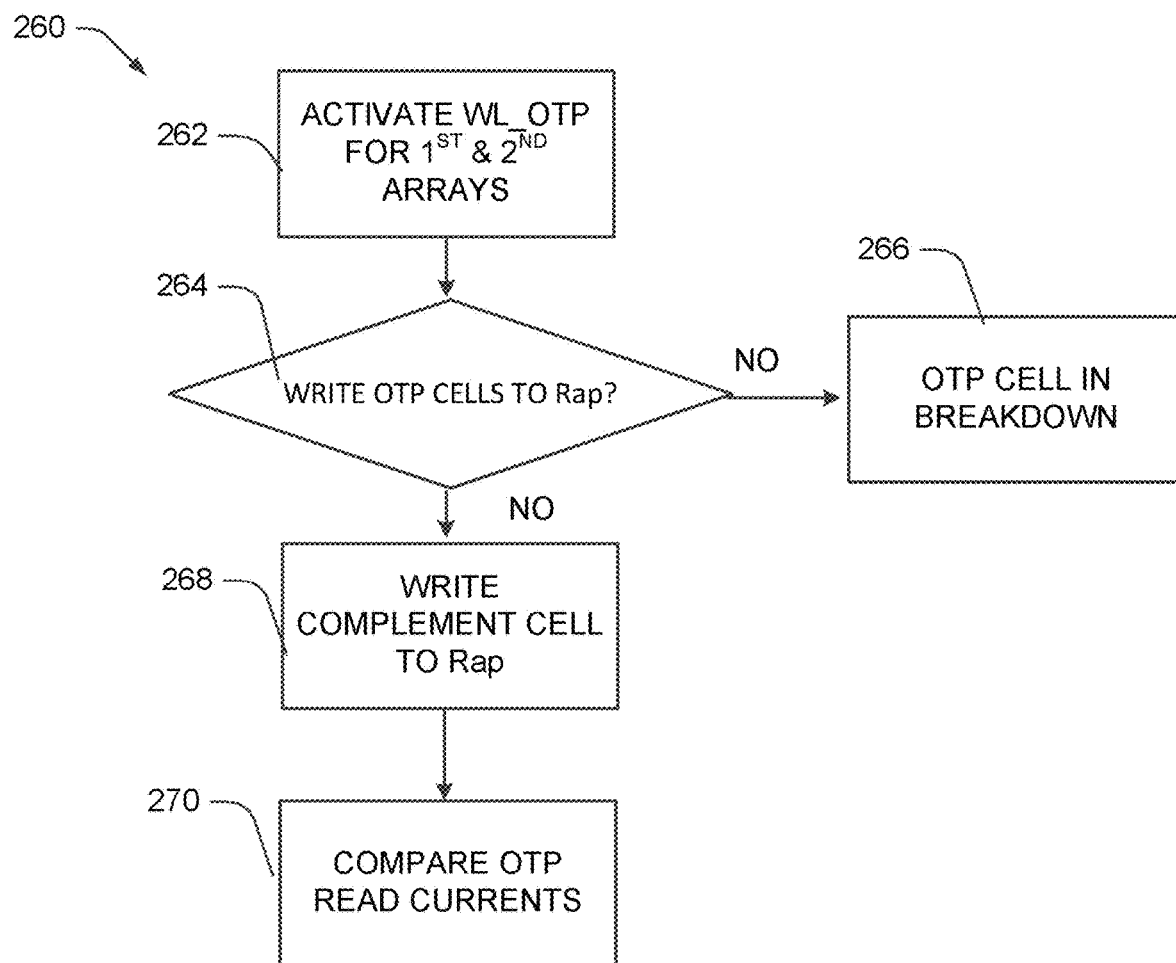
FIG. 12 is flow diagram illustrating another example of a 2CPB OTP method in accordance with some embodiments.

FIG. 12 illustrates a 2CPB OTP read operation 260, which may be executed subsequent to a high temperature event such as WLCSP. At operation 262, the OTP word lines WL_OTP for both the first array 110 and the second array 111 are activated. Since the breakdown current is not applied for a read operation, the additional OTP word lines WL_OTP+ are not activated. At operation 264, a write current is applied to the OTP MRAM cells 114 of both the first array 110 and the second array 111 to attempt to write the OTP MRAM cells 114 to the anti-parallel Rap state. If the OTP MRAM cell 114 was previously written to the breakdown state during the OTP write process, it will not be possible to write the OTP MRAM cell 114 to the Rap state. In the example outlined above, the OTP MRAM cell 114 of the first array 110 was written to the breakdown state. As such, it would not be written to the Rap state at operation 264, verifying its breakdown state as shown in operation 266.

The complementary OTP MRAM cell 114 of the second array 111 was not previously written to the breakdown state. As such, it would be written to the Rap state in operation 268. A read voltage Vr is then applied to the bit lines BL[0] of both arrays 110, 111 to establish read currents in the respective OTP MRAM cell 114 and complementary OTP MRAM cell 114. The OTP MRAM cell 114 of the first array 110, which is in the breakdown state, would thus exhibit the breakdown read current Ibd as shown in FIG. 10. Conversely, the complementary OTP MRAM cell 114 of the second array 111, which is in the Rap state, would exhibit the read current Tap as shown in FIG. 10. cell 114. At operation 270 the sense amplifier 144 compares these read currents, which have a wide read margin as shown in FIG. 10.

In other examples, the complementary OTP MRAM cell 114 of the second array 111 is not specifically written to the Rap state (or the Rp) state, since both the Tap and Ip read currents are lower than the breakdown read current Ibd. In this situation, the OTP data is read based on comparing the breakdown read current to the state of the complementary OTP MRAM cell in either the Rap or Rp state. However, writing the complementary OTP MRAM cell to the Rap state provides the largest read margin as described above.

Disclosed examples thus provide an OTP solution using MRAM cells that stands up to harsh conditions, such as high temperature processes performed during semiconductor device manufacturing processes.

In some examples, a memory device includes a plurality of MRAM cells that include a first one-time programmable (OTP) cell. A first OTP select transistor is connected to the first OTP MRAM cell, and the first OTP select transistor is configured to selectively apply a breakdown current to the first OTP MRAM cell to write the first OTP MRAM cell to a breakdown state.

In accordance with further disclosed examples, a memory device has a first memory array that includes a plurality of first MRAM bit cells coupled to a first bit line. A plurality of first memory cell select transistors are each coupled between a corresponding one of the MRAM bit cells and a first source line. Each of the first memory cell select transistors has a gate terminal coupled to a corresponding memory word line. An OTP MRAM cell is coupled to the first bit line, and a plurality of first OTP select transistors are coupled in parallel between the first OTP MRAM cell and the first source line. Each of the first OTP select transistors has a gate terminal coupled to a first OTP word line.

In accordance with still further examples, a method includes providing a first MRAM cell array. A first write current is applied to a plurality of first MRAM bit cells in the first MRAM cell array to selectively write the first MRAM bit cells to a parallel state or an anti-parallel state. A breakdown current that is higher than the first write current is selectively applied to a first OTP MRAM cell in the first MRAM cell array to write the first OTP MRAM cell to a breakdown state.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a first MRAM cell array;
   a memory cell select transistor having a first threshold configured to selectively apply a first write current to a selected one of a plurality of first MRAM bit cells in the first MRAM cell array to selectively write the selected one of the first MRAM bit cells to a parallel state or an anti-parallel state;
   a first OTP select transistor having a second threshold lower than the first threshold configured to selectively apply a breakdown current higher than the first write current to a first OTP MRAM cell in the first MRAM cell array to write the first OTP MRAM cell to a breakdown state;
   a second MRAM cell array;
   a second OTP MRAM cell in the second array;
   a second OTP select transistor connected to the second OTP MRAM cell, the second OTP select transistor configured to selectively apply a breakdown current to the second OTP MRAM cell, the second OTP select transistor configured to selectively apply the breakdown current to the second OTP MRAM cell to write the second OTP MRAM cell to a breakdown state; and
   a memory controller configured to apply control signals to one of the first or second OTP select transistors, such that the first OTP MRAM cell is written to the breakdown state and the second OTP MRAM cell is not written to the breakdown state.

2. The memory device of claim 1, wherein each of the plurality of MRAM cells includes a magnetic tunnel junction (MTJ) element.

3. The memory device of claim 1, further comprising a plurality of OTP select transistors including the OTP select transistor, wherein the plurality of OTP select transistors are connected in parallel.

4. The memory device of claim 1, wherein the plurality of first MRAM cells includes a reference MRAM cell, the memory device further comprising:
   a reference select transistor connected to the reference MRAM cell, the reference select transistor configured to apply a write current to write the reference MRAM cell to a parallel state.

5. The memory device of claim 3, wherein the first MRAM cell array includes a dummy cell not connected to any of the plurality of OTP select transistors.

6. The memory device of claim 3, wherein the first MRAM cell array includes a plurality of dummy cells not connected to any of the plurality of OTP select transistors.

7. The memory device of claim 1, wherein the memory cell select transistor is connected between the selected one of the plurality of first MRAM bit cells in the first MRAM cell array and a source line.

8. A method, comprising:
   controlling a memory cell select transistor to selectively apply a first write current to a selected one of a plurality of first MRAM bit cells to selectively write the selected one of the first MRAM bit cells to a parallel state or an anti-parallel state;

determining whether a first one-time-programmable (OTP) MRAM cell has previously been written to a breakdown state;

based on the determining, controlling an OTP select transistor to selectively apply a breakdown current higher than the first write current to the first OTP MRAM cell to write the first OTP MRAM cell to a breakdown state; and wherein the plurality of first MRAM bit cells include at least one dummy MRAM cell not connected to a corresponding one of the memory cell select transistors.

9. The method of claim 8, wherein controlling the OTP select transistor includes controlling a plurality of the OTP select transistors connected in parallel.

10. The method of claim 8, wherein controlling the memory cell select transistor includes receiving a memory word line signal at a gate terminal of the memory cell select transistor.

11. The method of claim 8, wherein controlling the OTP select transistor includes receiving an OTP word line signal at a gate terminal of the OTP select transistor.

12. The method of claim 8, wherein determining whether the first OTP MRAM cell has previously been written to a breakdown state includes comparing a current of the OTP MRAM cell to a reference current of a reference cell.

13. The method of claim 8, wherein each of the plurality of first MRAM bit cells includes a magnetic tunnel junction (MTJ) element.

14. The method of claim 9, controlling a plurality of the OTP select transistors connected in parallel includes controlling a predetermined number of the OTP select transistors.

15. A method, comprising:

providing a plurality of first MRAM bit cells;

controlling a memory cell select transistor to selectively apply a first write current to a selected one of the plurality of first MRAM bit cells to selectively write the selected one of the first MRAM bit cells to a parallel state or an anti-parallel state;

providing an OTP MRAM cell;

providing a plurality of OTP select transistors coupled in parallel between the OTP MRAM cell and a first source line;

determining a number of the OTP select transistors for applying a desired breakdown current higher than the first write current to the OTP MRAM cell; and controlling the determined number of the OTP select transistors to selectively apply the desired breakdown current to the OTP MRAM cell to write the first OTP MRAM cell to a breakdown state;

wherein the plurality of first MRAM bit cells are arranged in a first memory array; and wherein the first memory array includes a plurality of dummy cells not connected to any of the memory cell select transistors.

16. The method of claim 15, wherein controlling the determined number of OTP select transistors includes receiving an OTP word line signal at a corresponding gate terminal of each of the OTP select transistors.

17. The method of claim 15, wherein controlling the memory cell select transistor includes receiving a memory word line signal at a gate terminal of the memory cell select transistor.

18. The method of claim 15, further comprising:

providing a second OTP MRAM cell;

wherein controlling the determined number of the OTP select transistors includes selectively applying the desired breakdown current to only one of the first OTP MRAM cell or the second OTP MRAM cell, such that only one of the first OTP MRAM cell or the second OTP MRAM cell is written to the breakdown state.

19. The method of claim 18, further comprising:

comparing a first OTP read current of the first OTP MRAM cell to a second OTP read current of the second OTP MRAM cell to read OTP data.

20. The method of claim 19, wherein selectively applying the breakdown current to only one of the first OTP MRAM cell or the second OTP MRAM cell comprises applying the breakdown current to only the first OTP MRAM cell, the method further comprising:

applying the first write current to the second OTP MRAM cell to write the second OTP MRAM cell to the anti-parallel state.

* * * * *